United States Patent
Kanazuka

[19]

[11] Patent Number: 6,003,055
[45] Date of Patent: Dec. 14, 1999

[54] DIGITAL FILTER INTERPOLATION CIRCUIT

[75] Inventor: Naomi Kanazuka, Tokyo, Japan

[73] Assignee: NEC Corporation, Tokyo, Japan

[21] Appl. No.: 08/865,807

[22] Filed: May 30, 1997

[30] Foreign Application Priority Data

Jun. 3, 1996 [JP] Japan ................................ 8-140396

[51] Int. Cl.$^6$ ........................................................ G06F 7/52
[52] U.S. Cl. ........................................................ 708/312
[58] Field of Search ........................... 364/759; 375/28; 348/556; 382/260; 235/156

[56] References Cited

U.S. PATENT DOCUMENTS

| | | | |
|---|---|---|---|
| 4,012,628 | 3/1977 | Gersho | 235/156 |
| 4,972,436 | 11/1990 | Halim et al. | 375/28 |
| 5,287,299 | 2/1994 | Lin | 364/759 |
| 5,384,600 | 1/1995 | Kaizaki et al. | 348/556 |
| 5,668,895 | 9/1997 | Yamazaki et al. | 382/260 |

FOREIGN PATENT DOCUMENTS

| | | |
|---|---|---|
| 63-160406 | 7/1988 | Japan . |
| 1-258502 | 10/1989 | Japan . |
| 3-262205 | 11/1991 | Japan ........................... H03H 17/02 |
| 4-207516 | 7/1992 | Japan . |
| 5-259815 | 10/1993 | Japan . |
| 5-327558 | 12/1993 | Japan . |
| 8-65107 | 3/1996 | Japan . |

*Primary Examiner*—Hassan Kizou
*Assistant Examiner*—Omar A. Omar
*Attorney, Agent, or Firm*—Young & Thompson

[57] ABSTRACT

An interpolation circuit for a digital filter which is small in circuit scale, operates at a high speed and is low in power consumption. The digital interpolation filter circuit includes front-end circuit 1 which outputs added value $\Sigma_i$ of input data and the last data, and filter unit 2. Filter unit 2 includes delay circuit unit 3 which delays added value $\Sigma_i$ of one clock and two clocks intervals, and outputs the delayed values, bit shift circuit unit 4 which inverts the signs of the added value and data obtained by delaying the added value 2 clocks interval and outputs resulting values and which shifts the data delayed one clock interval from the added value, 3 bits and one bit making multiplication of the delayed added value by 8 and 2, respectively, and outputs resulting values, adder 5 for adding the outputs of bit shift circuit unit 4 for each data having the same delay amount, and bit shift circuit 6 for shifting a result of the addition by 4 bits to divide the addition result by 16.

6 Claims, 3 Drawing Sheets

DIGITAL FILTER INTERPOLATION CIRCUIT

BACKGROUND OF THE INVENTION

1. Field of the Invention

This invention relates to a digital filter, and more particularly an interpolation circuit for a digital filter.

2. Description of the Related Art

As a related art apparatus, a "Digital Filter Circuit" is disclosed in Japanese Patent Laid-Open Application No. Heisei 3-262205. In order to form a modulator using the digital filter circuit, an interpolation circuit must be interposed between a finite impulse response (FIR) filter which shapes a wave form of a base band signal so that it has a roll-off spectrum characteristic and a complex multiplier for multiplication by a carrier. For the interpolation method, various methods such as linear interpolation are available. However, for interpolation with a high degree of accuracy, Lagrange interpolation or the like interpolation methods are used. The Lagrange interpolation is an interpolation method wherein, for given different n+1 points $(X_i, Y_i)$ (i=0, 1, 2, ..., n), Y=f(X) is approximated with a polynomial of degree n $$Pn(X) = a_0 + a_1 X + a_2 X^2 + \ldots + a_n X^n$$

which satisfies $$P_n(X_i) = Y_i \ (i=0, 1, 2, \ldots, n)$$

Pn(X) is called interpolation polynomial of degree n. The coefficients of the interpolation polynomial are determined from the term that the given different n+1 points $(X_i, Y_i)$ (i=0, 1, 2, ..., n) are solutions to the equation $$Pn(X_i) = Y_i \ (i=0, 1, 2, \ldots, n)$$

Particularly where data distance $\Delta X = X_{i+1} - X_i$ is fixed, the interpolation polynomial for calculation of data $((X_{i-2}+X_{i-1})/2, Z)$ between data $(X_{i-2}, Y_{i-2})$ and $(X_{i-1}, Y_{i-1})$ is given as a well-known expression $$Z = P_n(Y) = (-Y_{i-3} + 9Y_{i-2} + 9Y_{i-1} - Y_i)/16$$

where n=3.

An example of an interpolation circuit of a conventional digital filter is shown in FIG. 1. This circuit comprises delay units 15, 16, and 17, multipliers 18, 19, 20 and 21 and adders 22, 23 and 24. Each of delay units 15, 16 and 17 delays an input signal by a one clock interval, and each of multipliers 18, 19, 20 and 21 outputs an input signal multiplied by a tap coefficient in the block. Further, each of adders 22, 23 and 24 outputs a sum of two input signals.

Next, operation of the conventional circuit is described hereinafter. Inputted data $Y_i$ is successively delayed by delay units 15, 16 and 17, and delayed data $Y_{i-1}$ is outputted from delay unit 15, $Y_{i-2}$ from delay unit 16, and $Y_{i-3}$ from delay unit 17. Further, $Y_i$ is multiplied by −1 by multiplier 18, $Y_{i-1}$ by 9 by multiplier 19, $Y_{i-2}$ by 9 by multiplier 20, and $Y_{i-3}$ by −1 by multiplier 21. Output values of the multipliers are added by adders 22, 23 and 24 so that output Z $$Z = (-Y_{i-3} + 9Y_{i-2} + 9Y_{i-1} - Y_i)/16$$

is obtained. From this, it can be seen that Lagrange interpolation of degree 3 has been performed.

The conventional digital filter interpolation circuit has the same structure as an ordinary FIR filter which performs roll-off waveform shaping, and cannot be used where the sampling frequency is high because it is inferior in terms of the operation speed. The conventional digital filter interpolation circuit is disadvantageous also in that, even where the sampling frequency is low and interpolation can be performed using an ordinary FIR filter, a large circuit scale requires unavoidable high power dissipation

SUMMARY OF THE INVENTION

It is an object of the present invention to provide an interpolation circuit for a digital filter which is small in circuit scale, operates at a high speed and is low in power dissipation.

According to the present invention, a digital interpolation filter circuit of the non-cyclic type according to a predetermined interpolation expression which includes a plurality of delay units connected in tandem, a circuit for multiplying delayed data successively delayed by the delay units by integers, and an adder for adding results of the multiplication, comprises a front-end circuit for converting input data, and a filter unit having means for representing coefficients of multiplications of the interpolation expression in binary bit expressions by powers of 2 based on the data converted by the front-end circuit and executing the multiplications by bit shift.

In a preferred form of the digital interpolation filter circuit of the present invention, the front-end circuit includes a delay circuit for delaying input data by one clock interval and an adder for adding input data and input data prior by one clock interval, and the filter unit includes an inverter for inverting the sign of the added value to multiply the added value by −1, a delay circuit for delaying the added value by one clock interval, a delay circuit for delaying the added value by another one clock interval, a bit shift circuit for shifting the added value delayed by a one clock interval by an interval of 3 bits of $2^3$ to multiply the added value by 8, another bit shift circuit for shifting the added value delayed by a one clock interval by an interval of one bit of $2^1$ to multiply the added value delayed by a one clock interval by 2, another interval for inverting the sign of the data delayed by a two clock interval from the added value, another adder for totally adding outputs of the invertor, bit shift circuits and inverter for each same delay amount, and a bit shift circuit for shifting an output of the adder by 4 bits of $2^4$ to multiply the output of the adder by 1/16.

Further, the digital interpolation filter circuit of the present invention operates such that the frontend circuit sends an added value of the last input data delayed by a one clock interval and current input data, and the filter unit inverts the sign of the added value and outputs a resulting value, delays the added value by one clock interval and shifts the delayed value by 3 bits of $2^3$ and 1 bit of $2^1$ to multiply the delayed value by values of 2 raised by the respective power numbers, delays the added value by a two clock interval and outputs the delayed value with the sign thereof inverted, adds all of the outputs for each data of the same delay amount, and shifts a result of the addition by 4 bits of $2^4$ to perform division of the result of the addition by 16.

The digital interpolation filter circuit of the present invention is constructed such that, by the operation described above, where input data $(Y_{i-3})$ prior by three-clock intervals are represented by B, input data $(Y_{i-2})$ prior by two-clock intervals are represented by C, the last input data $(Y_{i-1})$ are represented by D, and current input data $(Y_i)$ are represented by E, the filter unit is constructed so that the output A thereof satisfies a relationship given by the following expression:

$$A=(-B+9C+9D-E)/16$$

DESCRIPTION OF THE PREFERRED EMBODIMENT

An embodiment of the present invention is described in detail with reference to the drawings.

Figure 1:
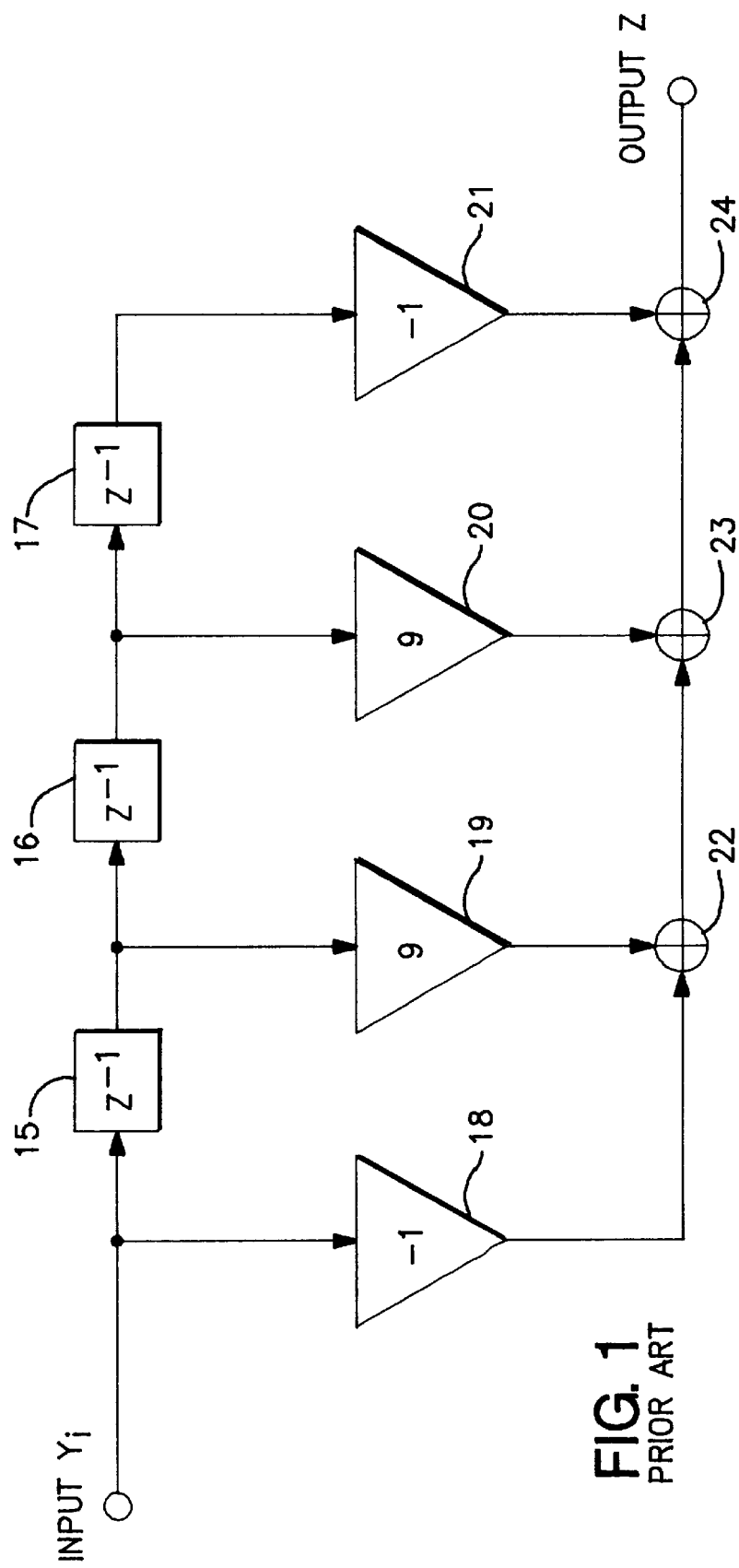
FIG. 1 is a block diagram showing an example of a conventional digital filter.
Figure 2:
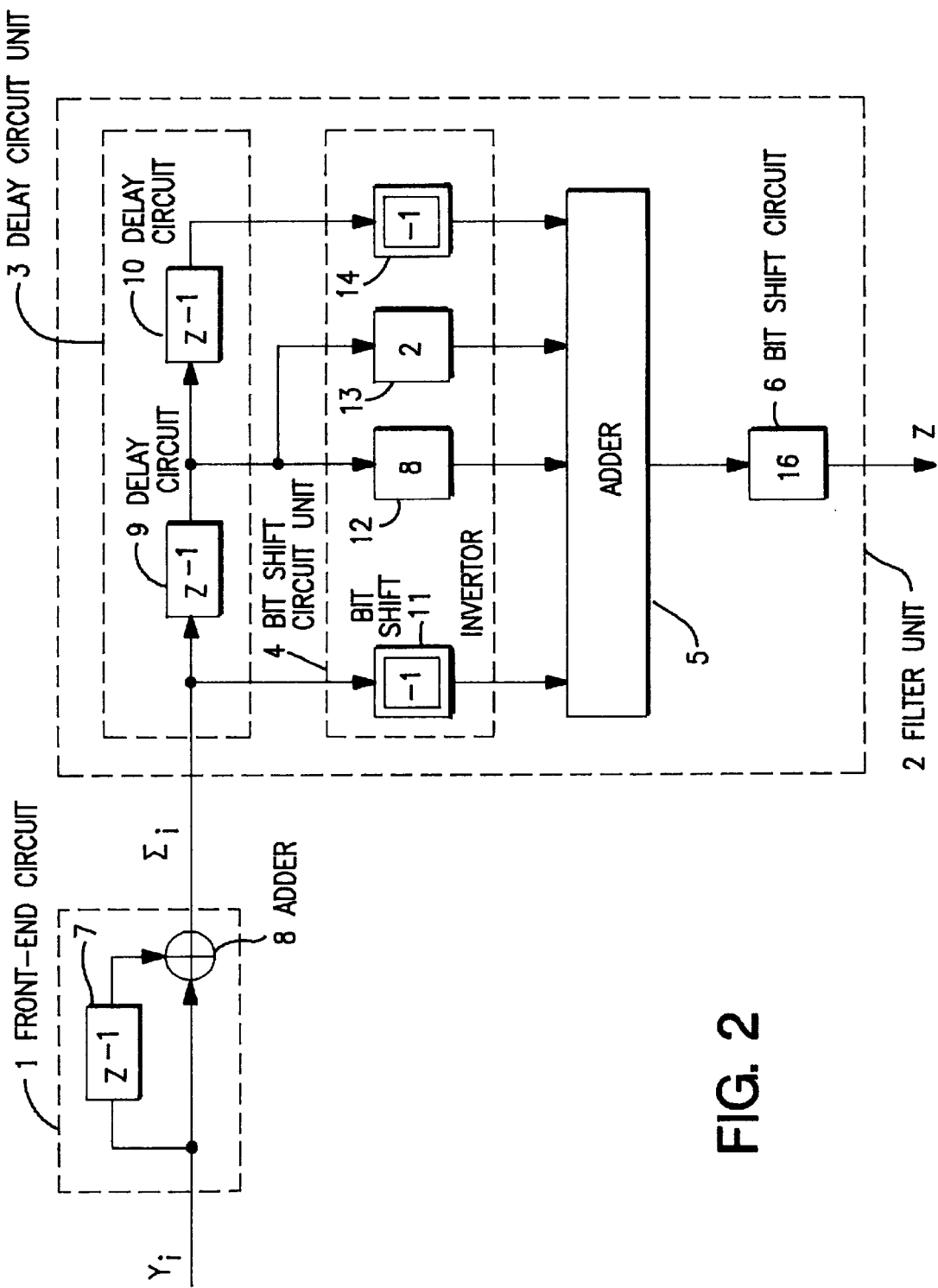
FIG. 2 is a block diagram of an embodiment of an interpolation circuit for a digital filter of the present invention.

FIG. 2 is a block diagram of an embodiment of an interpolation circuit for a digital filter of the present invention. Front-end circuit 1 in FIG. 2 is composed of delay circuit 7 and adder 8. In FIG. 2, $z^{-1}$ denotes a delay circuit for delaying data by a one clock interval, and the delay circuit is actually formed from a shift register, a flip-flop or the like element. + denotes an adder which outputs a sum of input signals. Input signal $Y_i$ to front-end circuit 1 is branched into two in the inside of front-end circuit 1, wherein one branch is inputted directly to adder 8 while the other branch is inputted to delay circuit 7. Delay circuit 7 outputs an input preceding by a one clock interval to the current input. Delay circuit 7 is connected to adder 8, and adder 8 outputs sum $\Sigma_i=Y_i+Y_{i-1}$ of input signal $Y_i$ to front-end circuit 1 and output $Y_{i-1}$ of delay circuit 7. The output of adder 8 is connected to filter unit 2, and the output of adder 8 serves as an input to filter unit 2.

Filter unit 2 is composed of delay circuit unit 3, bit shift circuit unit 4, adder 5 and bit shift circuit 6. It is to be noted that each square block represents a bit shift circuit, and the number of bits to be shifted is indicated by a numeral in the inside of it. Further, each double square block represents an inverter for inverting the sign, and the inverter is formed from an inverter or the like element. Adder 5 is formed as a multiple-input adder. Delay circuit unit 3 includes delay circuits 9 and 10, which receive $\Sigma_i$ and output inputs $\Sigma_{i-1}$ and $\Sigma_{i-2}$ thereto, respectively. Bit shift circuit unit 4 includes bit shift circuits 12 and 13, and sign inverters 11 and 14. Sign inverter 11 is connected to input $\Sigma_i$ and multiplies input $\Sigma_i$ by −1. Bit shift circuits 12 and 13 are connected to delay circuit 9 and shift output $\Sigma_{i-1}$ of delay circuit 9 by 3 bits corresponding to the power number 3 of $2^3$ and 1 bit corresponding to the power number 1 of $2^1$ to effect multiplication by 8 corresponding to 2 raised to the third power and multiplication by 2, respectively. Sign invertor 14 is connected to the output of delay circuit 10 and multiplies output $\Sigma_{i-2}$ of delay circuit 10 by −1. Adder 5 receives the outputs of bit shift circuit unit 4, executes addition of the bit shifted signals and outputs a result of the addition. Bit shift circuit 6 shifts the output of adder 5 by 4 bits corresponding to the power number of $2^4$ to effect division by 16 equal to 2 raised to the fourth power.

Figure 3:
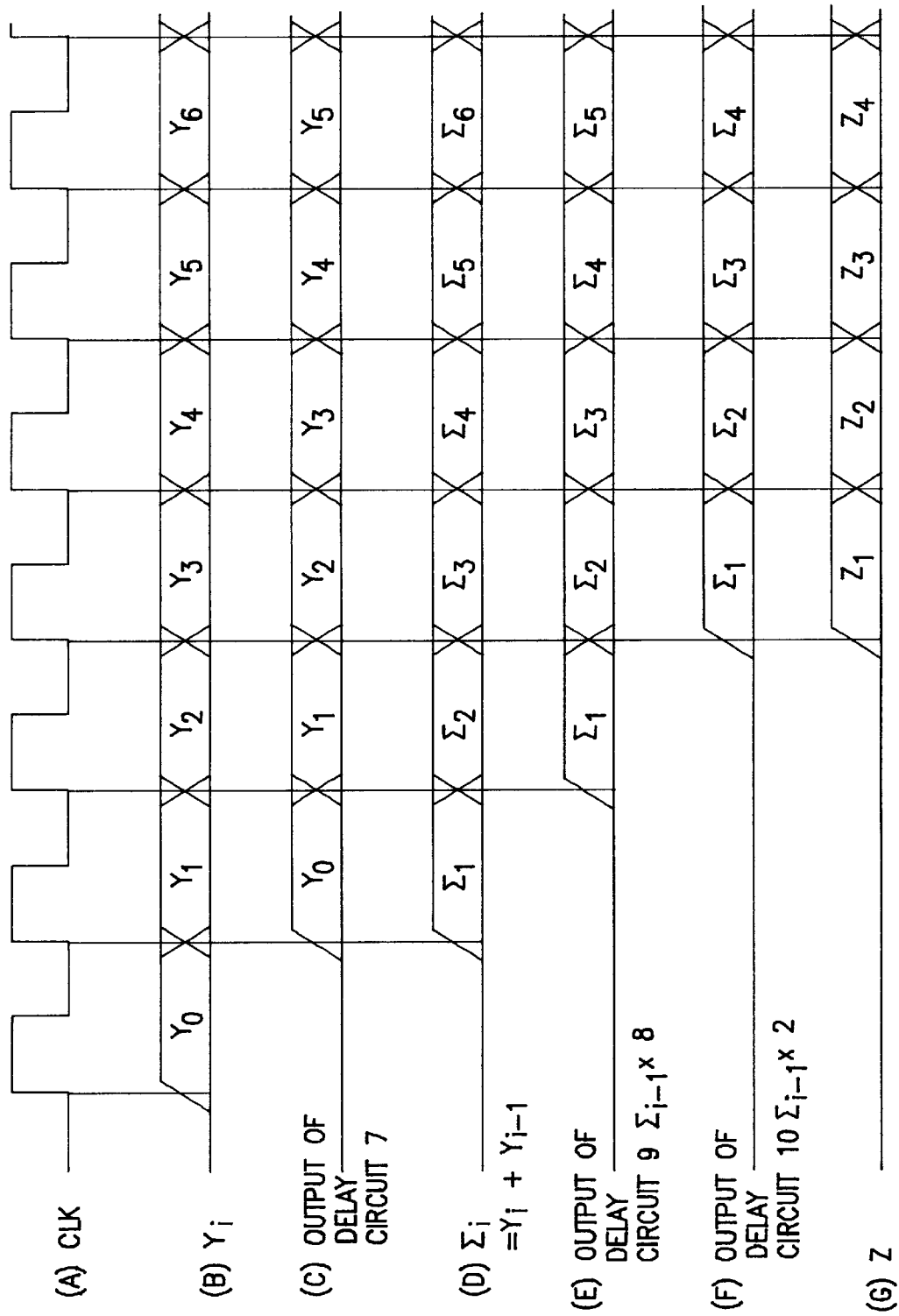
FIG. 3 is a waveform diagram showing sequences of signal waves of the embodiment shown in FIG. 2.

Next, operation of the circuit is described with reference to FIG. 3. CLK shown at (a) denotes a clock. When input signal $Y_i$ shown at (b) is inputted, frontend circuit 1 outputs $\Sigma_i=Y_i+Y_{i-1}$ shown at (d) which is a result of addition of input $Y_i$ and input $Y_{i-1}$ preceding by a one clock interval shown at (c). Delay circuit unit 3 receives input $\Sigma_i$ and outputs $\Sigma_{i-1}$ shown at (e) and $Z_{i-2}$ shown at (f). Bit shift circuit unit 4 multiplies $\sigma_i$ by −1, $\Sigma_{i-1}$ by 8 and 2 and $\Sigma_{i-2}$ by −1. Accordingly, the inputs to adder 5 are $-\Sigma_i$, $8\Sigma_{i-1}$, $2\Sigma_{i-1}$ and $-\Sigma_{i-2}$. Adder 5 outputs the sum of the inputs just mentioned, that is, $-\Sigma_i+8\Sigma_{i-1}+2\Sigma_{i-1}-\Sigma_{i-2}$. Finally, $(-\Sigma_i+8\Sigma_{i-1}+2\Sigma_{i-1}-\Sigma_{i-2})/16$ obtained by multiplying the output $-\Sigma_i+8\Sigma_{i-1}+2\Sigma_{i-1}-\Sigma_{i-2}$ of adder 5 by 1/16 is outputted from bit shift circuit 6. By substituting $\Sigma_i=Y_i+Y_{i-1}$ into output $\Sigma_i$, $Z=(-Y_{i-3}+9Y_{i-2}+9Y_{i-1}-Y_i)/16$ shown at (g) in FIG. 3 is obtained.

Consequently, it can be seen that Lagrange interpolation of degree 3 has been performed.

As described above, since a filter according to the present invention is formed without using a multiplier, it has an effect that the scale of an interpolation filter circuit can be reduced. Further, since the circuit scale is small and the number of logic circuits used can be reduced comparing with conventional circuits, there is another effect that high speed operation and reduction in power dissipation can be achieved.

What is claimed is:

1. A non-cyclic type digital interpolation filter for interpolating according to a predetermined interpolation expression, comprising:

a front-end circuit for converting input data comprising a delay circuit for delaying the input data one clock interval and a first adder for adding the input data and the input data delayed one clock interval so that for an input to said front-end circuit of $Y_i$, said front-end circuit output is $\Sigma_i=Y_{i-1}+Y_i$; and a filter unit operatively connected to said front-end circuit for accepting the converted input data and for delaying and multiplying the converted input data, executing each multiplication by shifting bits by a predetermined power of 2, said filter unit comprising a plurality of delay units connected in tandem for successively delaying converted input data, a multiplying circuit operatively connected thereto for multiplying by integers the successively delayed converted input data, a second adder for adding results of said multiplying circuit, and a bit shift circuit for multiplying a multiplying circuit output by 1/16, said plurality of delay units comprising a first delay circuit for delaying the front-end output one clock interval, and a second delay circuit for delaying the front-end output two clock intervals, said multiplying circuit comprising a first inverter for inverting the sign of the front-end circuit output to $\Sigma_i$, a first bit shift circuit for shifting an output of said first delay circuit by 3 bits of $2^3$ to multiply the output of said first delay circuit by 8, a second shift circuit for shifting the output of said first delay circuit by one 1 bit of $2^1$ to multiply the output of said first delay circuit by 2, and a second inverter for inverting the sign of a output of said second delay circuit, wherein said second adder adds outputs of said first inverter, said first shift circuit, said second shift circuit, and said second inverter as the multiplying circuit output.

2. A non-cyclic type digital interpolation filter for interpolating according to a predetermined interpolation expression, comprising:

a front-end circuit for converting input data to an front-end circuit output wherein for an input to said front-end circuit of $Y_i$, the front-end circuit output is $\Sigma_i=Y_{i-1}+Y_i$; and a filter unit operatively connected to said front-end circuit for accepting the converted input data and for delaying and multiplying the converted input data, executing each multiplication by shifting bits by a predetermined power of 2, wherein said filter unit comprises a plurality of delay units connected in tandem for successively delaying converted input data, a multiplying circuit operatively connected to said plurality of delay units for multiplying by integers the successively delayed converted input data, and an adder for adding results of said multiplying circuit designed and adapted so that said filter unit first: 1) inverts the sign of the front-end circuit output for a first output, 2) delays the front-end circuit output one clock interval and shifts the one clock interval delayed value 3 bits and 1 bit to multiply the one clock interval delayed value by 8 and 2 respectively for a second and third output, and 3) delays the front-end circuit output two clock intervals and inverts the sign of the two clock interval delayed value for a forth output; second, adds the first, second, third, and forth outputs to provide a summed output; and third, divides the summed output by 16.

3. A non-cyclic type digital interpolation filter for interpolating according to a predetermined interpolation expression, comprising:

a front-end circuit for converting current input data, and a filter unit operatively connected to said front-end circuit for accepting the converted input data and for delaying and multiplying the converted input data, executing each multiplication by shifting bits by a predetermined power of 2, wherein said filter unit comprises a plurality of delay units connected in tandem for successively delaying converted input data, a multiplying circuit operatively connected to said plurality of delay units for multiplying by integers the successively delayed converted input data, and an adder for adding results of said multiplying circuit and input data from a prior three-clock intervals, $Y_{i-3}$, are represented by B, input data from a prior two-clock intervals, $Y_{i-2}$, are represent by C, input data from a last input interval, $Y_{i-1}$, are represented by D, and the current input data, $Y_i$, is represented by E, said filter unit is designed and adapted to provide an output A satisfying a relationship given by the expression:

$$A=(-B+9C+9D-E)/16.$$

4. A non-cyclic type digital interpolation filter for interpolating according to a predetermined interpolation expression, comprising:

a front-end circuit for converting input data comprising a delay circuit for delaying input data one clock interval and an adder for adding input data and input data delayed one clock interval so that for an input to said front-end circuit of $Y_i$, said front-end circuit output is $\Sigma_i=Y_{i-1}+Y_i$; and a filter unit operatively connected to said front-end circuit for accepting the converted input data and for delaying and multiplying the converted input data, executing each multiplication by shifting bits by a predetermined power of 2, wherein said filter unit comprises a plurality of delay units connected in tandem for successively delaying converted input data, a non-cyclic multiplying circuit operatively connected to said plurality of delay units for multiplying by integers the successively delayed converted input data, and an adder for adding results of said multiplying circuit.

5. The interpolation filter of claim 4, wherein for an input represent by $Y_i$, said filter is designed and adapted to provide an output A satisfying a relationship given by the expression:

$$A=(-Y_{i-3}+9Y_{i-2}+9Y_{i-1}+y_i)/16.$$

6. The interpolation filter of 5, wherein said multiplying circuit is designed and adapted to perform all multiplications using shift registers.

* * * * *